USOO6339360B1

United States Patent
Santillano

(10) Patent No.: US 6,339,360 B1
(45) Date of Patent: Jan. 15, 2002

(54) DIGITAL AMPLIFIER WITH PULSE INSERTION CIRCUIT

(75) Inventor: Lee Carlos Santillano, Meridian, MS (US)

(73) Assignee: Peavey Electronics Corporation, Meridan, MS (US)

( * ) Notice: Subject to any disclaimer, the term of this patent is extended or adjusted under 35 U.S.C. 154(b) by 0 days.

(21) Appl. No.: 09/567,327

(22) Filed: May 9, 2000

(51) Int. Cl.[7] ................................................. H03F 3/38
(52) U.S. Cl. ...................... 330/10; 330/207 A; 330/251; 375/238
(58) Field of Search ............................... 330/10, 207 A, 330/251; 375/238

(56) References Cited

U.S. PATENT DOCUMENTS

| 4,479,175 | A |   | 10/1984 | Gille et al. |
|---|---|---|---|---|
| 4,992,751 | A |   | 2/1991 | Attwood et al. |
| 5,387,875 | A | * | 2/1995 | Tateno .......................... 330/10 |
| 5,389,829 | A | * | 2/1995 | Milazzo ....................... 327/172 |
| 5,815,581 | A | * | 9/1998 | Anderson .................... 330/251 |
| 5,917,369 | A |   | 6/1999 | Nguyen |
| 5,929,702 | A |   | 7/1999 | Myers et al. |
| 6,016,075 | A | * | 1/2000 | Hamo .......................... 330/10 |

FOREIGN PATENT DOCUMENTS

| JP | 54-10653 | 1/1979 |
|---|---|---|
| JP | 4-315312 | 11/1992 |

OTHER PUBLICATIONS

Rimskikh, E.I., Turov, A.I. Dronov A.P., et al., "Pulsewidth modulator with two sided pulsewidth reduction" Bul. 35/25 Sep. 1976, Dec. 23, 1974 as 089412, p. 840., Sverd Natural Econ 23.12.74–SU–089412 (Dec. 17, 1976) H03K–07/08 *abstract*.

David Arthur Sauer, "Correction Scheme for Non–Linear Ramp Tip In A Pulse–Width Modulator", TN No.: 1257 (Sep. 8, 1980), Technical Notes: A Publication of RCA/ Princeton, NJ (2 pages).

Vodolagin, Yu A., "Pulsed secondary supply control pulse–width modulator", SU 1001–459–A, 83/849855/51, U22 U24, Mar. 12, 1980, SU–211699 *abstract*.

Harris Semiconductor, (http://www.zettweb.com/CDROMs/cdrom006/drivers/audioamp.htm), Class D Audio Amplifier Evaluation Board HIP4080AEVAL2, Mar. 29, 2000 (3 pages).

* cited by examiner

Primary Examiner—Robert Pascal
Assistant Examiner—Patricia T. Nguyen
(74) Attorney, Agent, or Firm—Dykema Gossett PLLC

(57) ABSTRACT

A digital amplifier having an input for receiving an input signal employs an oscillator for producing a reference pulse signal and a sawtooth signal. A first generating circuit coupled to the oscillator is responsive to the reference pulse signal for producing a first pulse signal of a first polarity. A second generating circuit coupled to the first generating circuit is responsive to said first pulse signal for producing a second pulse signal of a polarity opposite the first polarity. A comparator responsively coupled to the input and said oscillator compares the input signal and the sawtooth signal and produces a comparator output signal operable between first and second states, for toggling the comparator output signal between the first and second states each time the input signal equals the sawtooth signal. The comparator output is maintained in the first or second state when the input signal exceeds the sawtooth signal. A pulse insertion circuit responsively coupled to the comparator and the first and second generating circuits produces an insertion signal during intervals when the comparator output is maintained in either of the first or second states.

9 Claims, 4 Drawing Sheets

DIGITAL AMPLIFIER WITH PULSE INSERTION CIRCUIT

BACKGROUND OF THE INVENTION

The invention relates to digital amplifiers and more particularly to a pulse width modulated (PWM) audio amplifier employing a pulse insertion circuit for maintaining circuit operation in overdriven conditions and for preventing damage to amplifier components when the output is grounded.

Conventional linear amplifiers modulate load power by varying the conduction through output devices such as transistors or vacuum tubes. This continuous variation implies operation of the output devices in a region of linear response. Dissipated power is equal to the product of voltage across and current through the device. As a result, such output devices in linear amplifiers must dissipate considerable power. The dissipated power represents a loss in the efficiency of the amplifier. In addition, the energy lost must be removed from the device in order to avoid overheating. As a result, linear amplifiers have intrinsic efficiency limitations, and require complicated and expensive heat dissipation schemes.

In contrast, digital amplifiers, for example class D devices, operate by using an incoming analog signal to modulate a digitally switched signal. The digital signal is amplified and demodulated to produce an amplified version of the analog input. Modulation switching transistors in saturation are cut off, with only brief transitions between each cycle through the linear region of operation. Consequently, thermal losses due to dissipated power through the output device tend to be much smaller than corresponding losses in an analog amplifier.

Digital amplifiers, however, generally have higher component counts and are more complex than corresponding linear amplifiers. These factors result in higher direct costs for components, higher development costs, increased process risks during manufacture and increased failure risks thereafter. It is therefore desirable to reduce the component count of an effective digital amplifier while maintaining performance advantages offered by digital switching.

FIG. 1 shows a general block diagram of a conventional pulse-width modulation system 100. FIGS. 2A and 2B show exemplary waveforms of the system 100 under normal and overmodulated conditions, respectively.

An oscillator 101 produces a square wave clock signal or reference pulse R output at a frequency FR, and a sawtooth output S, at a frequency 2FR. An input signal IN is amplified through a gain stage 102 and a feedback stage 103. The output of the feedback stage 103 is coupled to one input of a comparator 104 as CIN signal. The sawtooth signal S is coupled to other input of the comparator 104.

The comparator 104 generates a pulse-width modulated (PWM) gate drive signal G. The gate drive G toggles between high and low states, as shown in FIG. 2. The PWM gate drive signal G is coupled via drivers 106 and 107 to MOSFET power switches 108 and 109 for amplification. The amplified PWM signal is coupled to a load 111, e.g., speaker via an output filter 110, where the carrier signal is removed. Negative feedback in the form of a sample FS from the output filter 110 is coupled to an input to the feedback stage 103 as shown to reduce signal distortion.

The above-described modulator works satisfactorily under input signal conditions illustrated in FIG. 2A. However, if the input to the comparator signal is overdriven, i.e., IN exceeds the peak amplitude of the sawtooth S, as shown in FIG. 2B, the gate drive signal G fails to toggle and is maintained in one state or the other. The condition known as overmodulation causes the gate drive signal G to reduce to a DC level in the regions OM, instead of a pulse with modulated signal. This condition leaves one or the other of the MOSFETS 108 and 109 in an ON state until such time as the input IN returns below the peak amplitude of the sawtooth signal S. The impedance of the output load 111, which is generally 4 or 8 ohms, limits the current through the ON MOSFET during the over-modulated period and prevents component failure.

An optional gain control circuit 105, coupled between the output of the comparator 104 and a gain control input 102A of the gain stage 102, may be employed to reduce the gain of the gain stage 102 and thereby reduce or limit overmodulation. However, the gain control 105 is only operable over a finite dynamic range. Accordingly, if the input signal IN is increased beyond this amount, the gain control 105 ceases to function and the overmodulation condition can once again occur.

Although the amplifier 100 can function when this condition occurs, if the output load is shorted to ground, the overmodulated condition results in the ON MOFSET being current limited only by its internal ON-resistance, plus the impendance of the output filter 110, which is generally less than about 250 millihoms. Under these conditions the continuous current through the ON MOSFET will likely exceed its continuous current rating and cause component failure.

U.S. Pat. No. 4,724,396 describes a gain control circuit that reduces the gain of the gain stage when overmodulation occurs. The patent suffers from the above-described limitations.

U.S. Pat. No. 5,917,369 describes a pulse width modulated amplifier that employs output limiting logic and an automatic gain control circuit. The patent describes a circuit for inserting pulses into an overmodulated region of a PWM signal to prevent filter saturation when the amplitude of the input signal exceeds that of a modulating triangle wave reference. The square wave, synchronized to the modulating triangular wave triggers a monostable vibrator whereby pulses of fixed duration are generated. The arrangement requires a complex drive circuit and a high component count insertion circuit.

SUMMARY OF THE INVENTION

The invention is based upon the discovery that toggling pulses may be inserted in the output of a PWM amplifier during overmodulated periods so that the duty cycle of output switch can be limited. The arrangement lowers the current through the output device, e.g., MOSFET, and component failure is thereby avoided. The present invention inserts pulses using a simplified circuit whereby series connected circuits produce opposite polarity pulses for a insertion gate circuit.

An input muting circuit limits the current through the MOSFETs to reduce thermal losses during short circuit conditions thereby avoiding over-temperature conditions.

DESCRIPTION OF THE INVENTION

Figure 1:
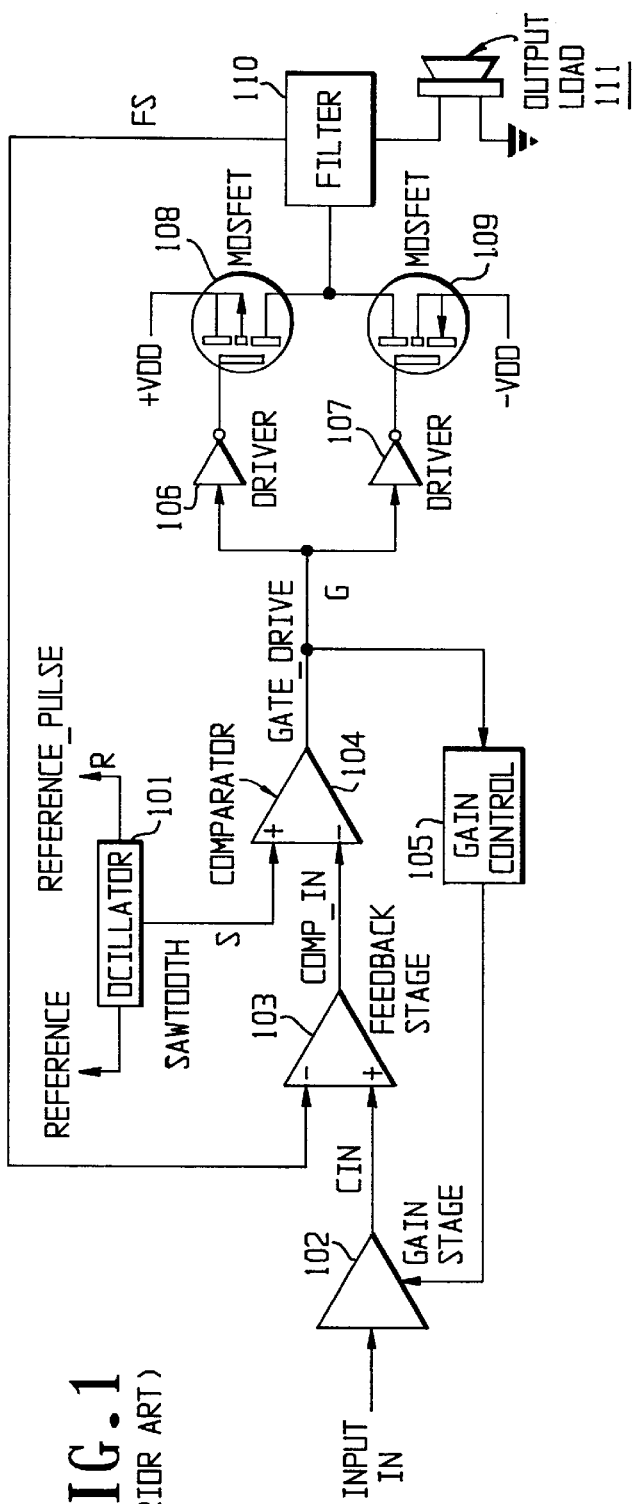
FIG. 1 is a schematic illustration in block form of a conventional pulse width modulation system.
Figure 2A:
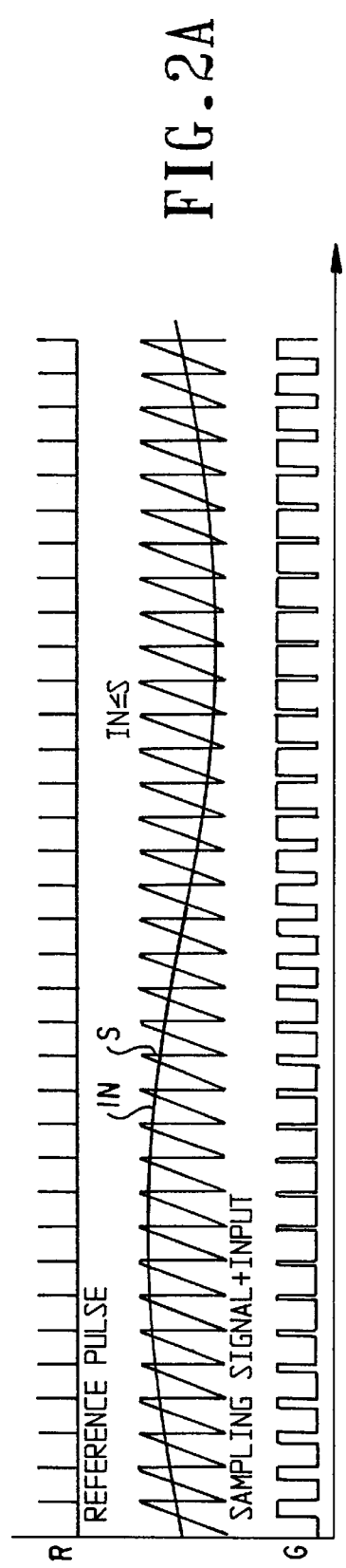
FIG. 2A is a wave form diagram for the arrangement of FIG. 1 under normal operating conditions.
Figure 3:
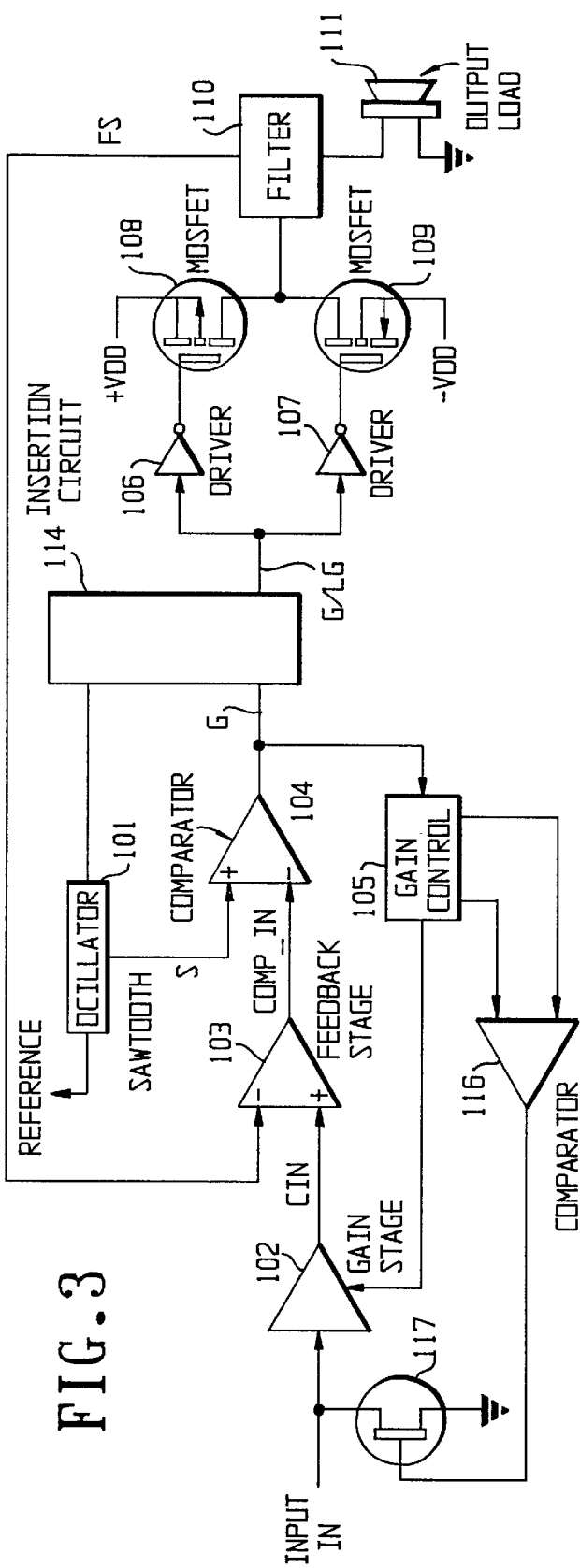
FIG. 3 is a schematic representation of a pulse width modulation system according to the present invention.
Figure 2B:
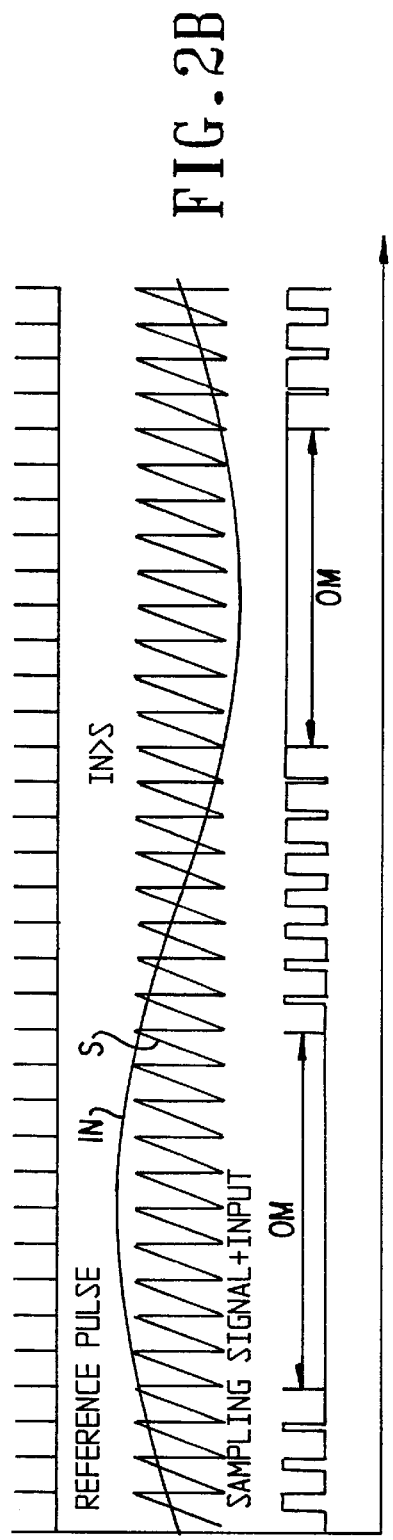
FIG. 2B is a wave form diagram of the arrangement of FIG. 1 under overmodulataed conditions.
Figure 4:
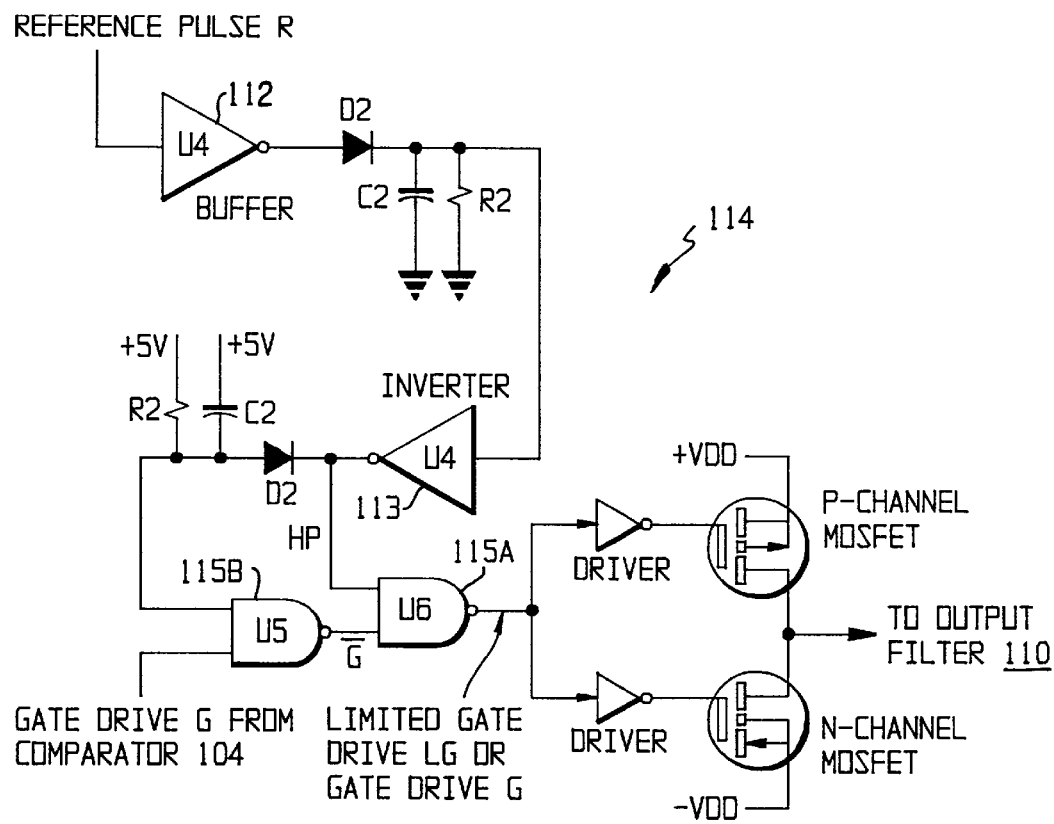
FIG. 4 is a schematic represssntation of the insertion circuit according to the invention.

An embodiment of a pulse width modulation (PWM) amplifier 200 in accordance with the present invention is shown in FIG. 3. Elements similar to those described with respect to FIG. 1 have the same reference numbers. Accordingly, oscillator 101 provides square wave reference signal R at frequency FS and sawtooth output S at frequency 2FS. Input signal IN is applied through gain stage 102 and the positive input of feedback stage 103. The output of the feedback stage 103 is coupled to one input of comparator 104 as a comparator input signal CIN. The sawtooth signal S is coupled to the other input of the comparator 104, as shown.

The comparator 104 generates a PWM gate drive signal G at its ouput. The gate drive G toggles between high and low states, as shown in FIG. 3A. The PWM gate drive signal G is coupled insertion circuit 114 and drivers 106 and 107 to MOSFET power switches 108 and 109 for amplification. The applied PWM signal G is coupled to the load 111 via output filter 110 where the carrier signal is removed. Negative feedback in the form of a sample from the output filter 110 is coupled to an the negative input of the feedback stage 103, as shown.

Figure 5A:
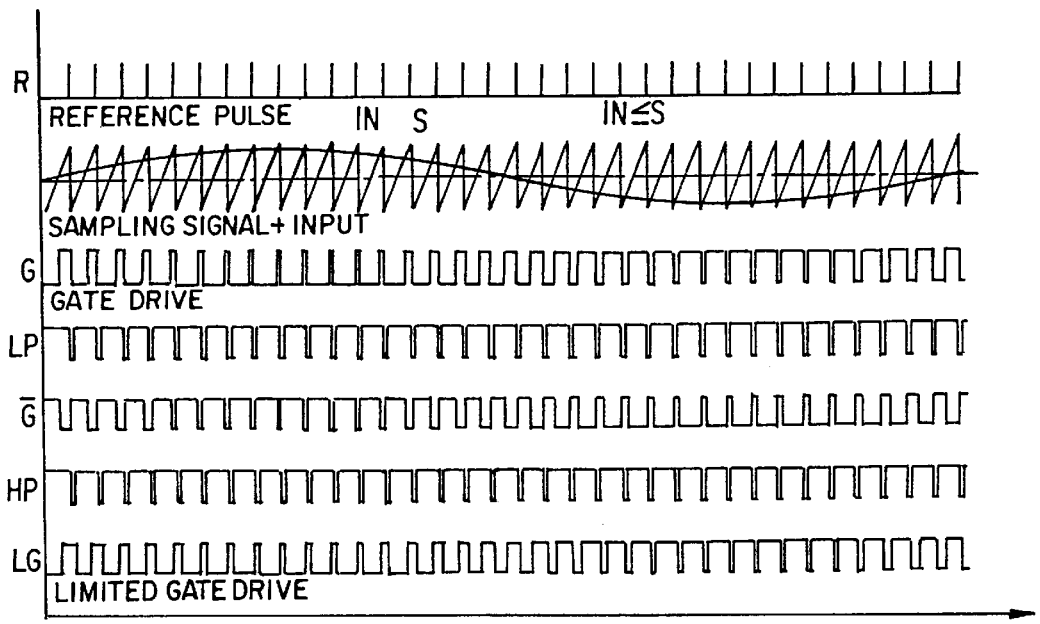
FIG. 5A is a waveform diagram of the circuits of FIGS. 3 and 4 operating under normal conditions.
Figure 5B:
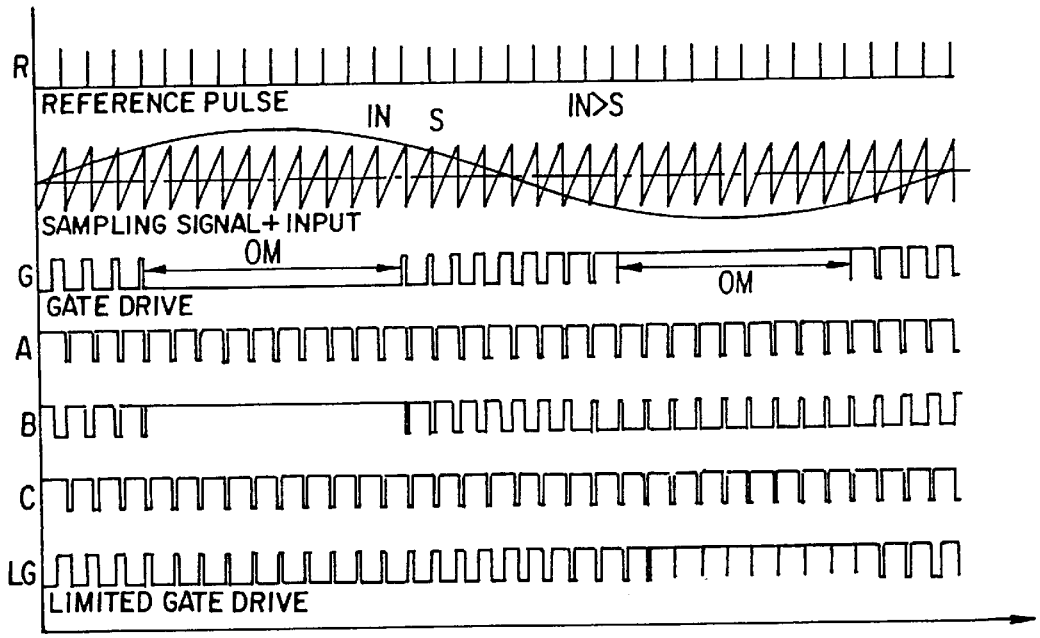
FIG. 5B is a waveform diagram of the circuits of FIGS. 3 and 4 illustrating pulse insertion under overmodulation conditions.

The insertion circuit 114 is responsive to the reference pulse output R of the oscillator 101 for introducing a limited gates signal LG in the form of fixed frequency pulses in the output signal G whenever the amplitude of the input signal IN exceeds the amplitude of the sawtooth S, as shown in FIG. 5B. The insertion circuit 114 includes a first signal generating circuit including a buffer 112 having an output diode D1 and a first output filter comprising capacitor C1 and parallel connected resistor R1. The circuit acts as a pulse stretcher for the reference pulses R. An inverter 113 is responsively coupled to the pulse stretching circuit and produces a first series of positive going pulses designated as high pulse inputs HP to a first gate circuit 115A. The output of the inverter 113 is coupled through a second signal generating circuit including a reverse biased diode D2 and a second pulse stretching circuit including parallel connected capacitor C2 and resistor R2. The output of the second pulse stretching circuit is a low pulse signal LP having a polarity opposite to that of the high pulse signal HP. The low pulse signal LP is coupled to an input of gate circuit 115B. The other input to the gate 115B is the output of the comparator 104.

Under normal operating conditions, the gate drive signal G from the comparator 104 toggles gates 115A and 115B to drive the MOSFETS 108 and 109 via drivers 106 and 107. However, whenever the input signal IN exceeds the amplitude of the sawtooth S, the gate drive signal G is maintained in one or another state. Under such circumstances, low pulse signals LP and high pulse signals HP are employed and toggle gates 115A and 115B, respectively, at a fixed frequency for driving the MOSFETS. The condition is illustrated in FIG. 5B, where during the overmodulation period OM, the gate insertion circuit 114 produces limited gate drive outputs LG. When the system is not overmodulated, the gate drive signal G passes through gates 115A and 115B for driving the MOSFETS.

The reference pulse R driving the pulse insertion circuit 114 is a pulse train that rises at the positive peak of the sawtooth S and falls at the negative peak thereof. The reference pulse R is buffered by amplifier 112. The output thereof is half-wave rectified through diode D1 and stretched by the parallel combination of the resistor R1 and capacitor C1. The signal is then passed through inverter 113 where it appears as a series of positive or high pulse HP signals which are coupled to gate 115A when the comparator output 104 is latched or maintained in a low condition. The output of the inverter 113 is also connected through the reverse bias half-wave rectifier D2 and delay circuit comprising resistor R2 and capacitor C2 in parallel, which stretches or delays the pulse long enough to create the negative or low pulses LP, which are offset with respect to the high pulses HP. The low pulses are coupled to gate 115B. The high pulse signal HPis inserted when the comparator 104 is latched low. The low pulse signal LP is inserted when the comparator 104 is latched high. In either case, a series of fixed frequency limited gate LG drive pulses are inserted into the input to the drivers to maintain the modulated condition.

Under normal operating conditions, that is, when the amplitude of the input IN does not exceed the amplitude of the sawtooth S, the high and low signals are masked by the gate drive signal G. However, under overmodulated conditions, the high and low pulse signals inject the necessary limited gate LG pulses to turn off and thereby protect the power MOSFETS 108 and 109. It should be understood that the values R1, C1 and R2, C2 may be varied so as to vary pulse width of the inserted gate drive signal. The arrangement of the present invention is achieved using far fewer components than in known systems where more complicated circuits are required.

Persistent overmodulation can occur which can cause damage to the power MOSFETS. Thus, in accordance with another feature of the invention, if such a condition exists, the gain control circuit 105 may be employed to sense when the comparator output latches, to thereby reduce gain of the gain stage 102. This, in combination with the insertion circuit 114 reduces the risk of component failure.

If a short occurs in the load 111, negative feedback FS from the output filter 110 to the feedback stage 103 is essentially eliminated causing an increase in the overall gain of the system. The extra gain can overdrive the gain control circuit 105 causing overmodulation. However, the insertion circuit 114 of the present invention protects the power MOSFETS from overcurrent failure by forcing turn-off at some minimum rate.

However, if the short condition persists, it is possible to damage the MOSFETS notwithstanding the insertion circuit, because the MOSFETS are running at maximum power. Accordingly, in accordance with another feature of the invention, in order to further protect the MOSFETS, the gain control circuit 105 coupled to the output of the comparator 104 produces a signal for a gain control comparator 116 which senses when the gain control exceeds a selected level. When this occurs, the comparator 116 turns on a JFET 117 coupled to the input of gain stage 102, which mutes the input signal IN. This places the power MOSFETS 108 and 109 in a low current state, rather than a high current state, while the output load remains shorted to ground.

While there has been described what at present is considered to be an exemplary embodiment of the invention, it should be apparent that those skilled in the art, that various changes and modifications may be made therein without departing from the invention, and it is intended that the appended claims to cover such changes and modifications as are found within the true spirit and scope of the invention.

What is claimed is:

1. A digital amplifier having an input for receiving an input signal comprising:

an oscillator for producing a reference pulse signal and a sawtooth signal;

a first signal generating circuit coupled to the oscillator responsive to said reference pulse signal for producing a first pulse signal of a first polarity;

a second signal generating circuit coupled to the first signal generating circuit responsive to said first pulse signal and producing a second pulse signal of a polarity opposite the first polarity;

a comparator responsively coupled to the input and said oscillator for comparing the input signal and the sawtooth signal and producing a comparator output signal operable between first and second states, said comparator for toggling said comparator output signal between the first and second states each time the input signal equals the sawtooth signal, said comparator output being maintained in one of the first and second states when the input signal exceeds the sawtooth signal;

a pulse insertion circuit responsively coupled to the comparator and the first and second signal generating circuits for producing an insertion signal during intervals when the comparator output is maintained in either of the first or second states.

2. The digital amplifier of claim 1, further comprising a negative feedback circuit for supplying feedback from the output to the input.

3. The digital amplifier of claim 1 further including a gain control means responsive to the comparator for reducing the gain of the amplifier when the input exceeds a selected level indicating increasing output gain.

4. The digital amplifier of claim 3, further including a gain control comparator coupled to the gain control means for gating the input signal when the gain control exceeds a selected limit.

5. The digital amplifier of claim 1, wherein the first and second signal generating circuits include oppositely poled rectifiers for producing the corresponding first and second signals of opposite polarity.

6. The digital amplifier of claim 5, wherein the first and second signal generating circuits further include pulse stretching means for establishing a selected time delay between the first and second signals.

7. The digital amplifier of claim 1, wherein the pulse insertion circuit includes first and second gates responsive to the first and second pulse signals respectively for producing a pulse output when the comparator signal is maintained in either of said first and second states.

8. The digital amplifier of claim 1, further including amplifier output means responsive to the insertion circuit output for producing an amplified output signal.

9. The digital amplifier of claim 1, further including feedback means coupled from the output to the input for establishing an overall feedback for the amplifier.

* * * * *